(12) United States Patent
Zhou

(10) Patent No.: US 7,535,620 B2
(45) Date of Patent: May 19, 2009

(54) MICRO-ELECTRO-MECHANICAL SYSTEM MICRO MIRROR

(75) Inventor: Tiansheng Zhou, Edmonton (CA)

(73) Assignees: Precisely Microtechnology Corp., Alberta (CA); Adamant Kogoyo Co. Ltd., Tokyo (JP)

(*) Notice: Subject to any disclaimer, the term of this patent is extended or adjusted under 35 U.S.C. 154(b) by 0 days.

(21) Appl. No.: 11/873,771

(22) Filed: Oct. 17, 2007

(65) Prior Publication Data

US 2008/0247029 A1 Oct. 9, 2008

Related U.S. Application Data

(60) Provisional application No. 60/921,522, filed on Apr. 4, 2007.

(51) Int. Cl.
G02B 26/00 (2006.01)
G02B 26/08 (2006.01)

(52) U.S. Cl. ............................... 359/290; 359/225

(58) Field of Classification Search .......... 359/198, 359/214, 224, 225, 290, 295, 298
See application file for complete search history.

(56) References Cited

U.S. PATENT DOCUMENTS

| | | | |
|---|---|---|---|
| 5,739,941 A * | 4/1998 | Knipe et al. ............... | 359/224 |
| 6,275,320 B1 | 8/2001 | Dhuler et al. | |
| 6,459,845 B1 | 10/2002 | Lee et al. | |
| 6,628,856 B1 | 9/2003 | Costello et al. | |
| 6,744,173 B2 * | 6/2004 | Behin et al. ............... | 310/309 |
| 6,751,395 B1 | 6/2004 | Novotny et al. | |
| 6,758,983 B2 | 7/2004 | Conant et al. | |
| 6,780,180 B1 | 8/2004 | Goble et al. | |
| 6,780,185 B2 | 8/2004 | Frei et al. | |
| 6,816,295 B2 | 11/2004 | Lee et al. | |
| 6,838,738 B1 | 1/2005 | Costello et al. | |
| 6,876,810 B2 | 4/2005 | Morimoto et al. | |
| 6,901,204 B2 | 5/2005 | Hong et al. | |
| 6,914,711 B2 | 7/2005 | Novotny et al. | |
| 6,915,061 B2 | 7/2005 | Li et al. | |
| 6,954,579 B2 | 10/2005 | Hsu | |
| 6,963,679 B1 | 11/2005 | Novotny et al. | |
| 6,980,727 B1 | 12/2005 | Lin et al. | |
| 6,996,306 B2 | 2/2006 | Chen et al. | |
| 7,071,109 B2 | 7/2006 | Novotny et al. | |
| 7,177,063 B2 * | 2/2007 | Krylov et al. ............... | 359/245 |
| 7,224,097 B2 | 5/2007 | Obi et al. | |

FOREIGN PATENT DOCUMENTS

| | | |
|---|---|---|
| CA | 2584571 | 10/2007 |
| FR | 861432 | 2/1941 |

(Continued)

Primary Examiner—William C Choi
(74) Attorney, Agent, or Firm—Davis & Bujold, P.L.L.C.

(57) ABSTRACT

A micro-electro-mechanical system (MEMS) micro mirror and a method of making the same. The micro mirror includes a body having a mirror support, opposed anchor s and flexible hinges which connect the mirror support to the anchor s. The mirror support has opposed comb edges with comb fingers. Electrodes, which have comb fingers to interact with the comb fingers of the mirror support, are spaced from the comb edges. The comb fingers along each of the comb edges of the mirror support surface are positioned on different horizontal planes from and the comb fingers on the electrodes so as to maximize electrostatic actuation.

21 Claims, 22 Drawing Sheets

FOREIGN PATENT DOCUMENTS

| | | |
|---|---:|---:|
| FR | 2 689 479 | 10/1993 |
| GB | 150052 | 8/1920 |
| GB | 254654 | 7/1926 |
| GB | 467264 | 6/1937 |
| JP | 59230872 | 12/1984 |
| JP | 60008169 | 1/1985 |
| JP | 60092176 | 5/1985 |

* cited by examiner

DETAIL A

DETAIL B

DETAIL C

DETAIL D

DETAIL E

DETAIL F

Taper shape hinge

Double beam hinge

MICRO-ELECTRO-MECHANICAL SYSTEM MICRO MIRROR

FIELD

The present invention relates to a micro mirror for use in micro-electro-mechanical systems.

BACKGROUND

MEMS (Micro-Electro-Mechanical systems) mirrors have wide applications in fiber optic networks, such as optical cross connect switches, optical attenuators, optical tunable filter etc. The most mature MEMS product in optical telecommunication industry is MEMS Variable Optical attenuator (VOA).

There are a number of MEMS VOAs disclosed in US patents. A micro shutter type MEMS VOA is disclosed in U.S. Pat. Nos. 6,275,320B1, 6,459,845B1, 6,751,395B1, 6,780,185B2, 6,816,295B2, 6,876,810B2, 6,901,204B2, 6,954,579B2, 6,980,727B1, 6,996,306B2 and 7,224,097B2. These VOAs use a micro shutter to partially block a light beam in order to achieve optical attenuation. These micro shutters are actuated by such means as electro-thermal actuation or electrostatic actuation. Micro shutter type of MEMS VOAs has difficulties, such as optical component alignment and hermetical packaging.

Micromirror type MEMS VOAs have advantages of simple packaging. The optical attenuation is realized by the tilting micro mirror, which redirects the light beam. The commercially available lens and TO metal cans can be readily available for low cost packaging of micro mirror type VOAs. As such, most of the commercial available MEMS VOAs use a tilting micro mirror. U.S. Pat. Nos. 6,628,856B1, 6,838,738B1, 6,915,061 6,963,679 and 7,224,097B2 disclose MEMS micro mirrors. These micro mirrors use electrostatic actuation. The electrostatic actuation is favored for micro mirror due to its low power consumption and relative small footprint.

In the disclosed prior arts, micro mirrors with electrostatic actuation fall into vertical combdrive type and parallel plate type. U.S. Pat. No. 6,838,738B1 disclosed vertical combdrive actuated micro mirror, it has several drawbacks of device design and fabrication. First of all, the design of the taller and shorter fingers using the same layer of material have some initial overlapping areas, which will have effect to against the actuation. The electrical field in this initial overlapping area has opposite contribution to the mirror actuation. Secondly, the micro mirror is required to have a certain minimum thickness to maintain its mechanical strength to overcome the residual stress of the reflective metal film on its top surface as well as environment vibration during its operation etc. Thinner than 20 microns of material will cause undesirable higher radius of curvature (ROC) of the micro mirror. If 20 microns of thick material is used to make taller and shorter fingers, it is very difficult to have good photolithography in its process step 840 since higher topography created in the previous step (step 830). Even if the photolithography can be managed, then the finer finger gap has to be sacrificed, which in turn results in higher actuation voltage. Thirdly, one metal coating is used in U.S. Pat. No. 6,838,738B1 for both reflective metal film on the mirror surface and metal film on the bonding pads for wire bonding. The requirements for both metal films are quite different. The requirements for the reflective metal film on the mirror surface are higher reflectivity within the light wavelength interested and low residual stress. Usually this metal film is very thin for easy residual stress control. On the other hand, the requirements for the bonding metal film on the bonding pads are thicker metal film for easy wire bonding and good electrical conductivity. Usually this bonding metal film is thicker and stressful. One metal coating process in U.S. Pat. No. 6,838,738B1 will cause either higher ROC of the micro mirror, poor reflectivity and/or poor wiring bonding. Fourthly, U.S. Pat. No. 6,838,738B1 disclosed the wet structure release processing step 890, which will cause stiction of the macrostructure such as fingers. Stiction will lead to defective devices. Last but not least, due to the existing and unavoidable process defects, the vertical combdrive actuator has tendency to rotate side ways so that the electrical shorting will occur from contact of fixed and movable fingers. Such electrical shorting can permanently destroy the device. There is no indication in U.S. Pat. No. 6,838,738B1 as to how to prevent undesirable side way rotation.

Compared with vertical combdrive actuator, parallel plate electrostatic actuators have following several disadvantages in all the prior arts. First of all, the pull-in effect of parallel plate electrostatic actuator of micro mirror limits the controllable tilting angle range under the certain actuation voltage. When actuation voltage is applied between fixed electrode and the movable hinged mirror, the resulting attractive electrostatic force will pull the mirror towards the fixed electrode to create tilting of hinged mirror. Initially, the mechanical restoring force from deformed hinge will balance the electrostatic force to keep the mirror in the controllable position. But when the actuation voltage is further increasing, and the tilting of the hinged mirror is over one third of the initial gap between the fixed electrode and the mirror, the electrostatic force between the electrode and the mirror surpasses the mechanical restoring force of the hinge, the hinged mirror will snap and physically contact to the fixed electrode. The usable and controllable tilting range of the mirror is very limited, only one third of the gap between the mirror and fixed electrode. Secondly, within the small controllable titling range, parallel plate electrostatic actuator won't provide linear actuation. In other word, the mirror tilting angle is not linear with the actuation voltage. Thirdly, higher actuation voltage causes issues of electrical charging, tilting angle drifting. In order to have larger controllable titling angle of the mirror, the gap between the fixed electrode and mirror has to be increased. Increased gap results in the higher actuation voltage. Higher driving voltage causes electrical charging on the dielectric materials of the micro mirror device, which will in turn cause the undesired tilting angle drifting of the mirror. Fourthly, squeezed air between movable mirror and fixed electrode during tilting will lead into air damping. Since the space between the movable mirror and fixed electrode is very small, the fast titling/switching of the micro mirror will cause the air between its mirror and electrode either compressed or decompressed. As such, the air damping from the squeezed air will effectively lower the tilting/switching speed of the mirror. Lastly, the micro fabrication process is costly and complex, especially for making complex actuation electrodes and electrical wirings of the micro mirrors.

SUMMARY

According one aspect there is provided a micro-electromechanical system (MEMS) micro mirror. The micro mirror includes a body having a mirror support portion, opposed anchor portions and flexible hinge portions which connect the mirror support portion to the anchor portions. The mirror support portion has a mirror support surface, a first comb edge, a second comb edge opposed to the first comb edge, and comb fingers extending outwardly from each of the first comb edge and the second comb edge. A first fixed electrode is spaced from the first comb edge of the mirror support portion and has comb fingers extending outwardly toward the mirror support portion to interact with the comb fingers on the first comb edge and interlace upon movement of the mirror support portion of the body in a first direction about the flexible hinges. Prior to being energized, the comb fingers along the first comb edge are positioned on one horizontal plane and the comb fingers of the first fixed electrode being on another horizontal plane. A second fixed electrode is spaced from the second comb edge of the mirror support portion and having comb fingers extending outwardly toward the mirror support portion to interact with the comb fingers on the second comb edge and interlace upon movement of the mirror support portion of the body in a second direction about the flexible hinges. Prior to being energized, the comb fingers along the second comb edge are positioned on one horizontal plane and the comb fingers of the second fixed electrode being on another horizontal plane.

According to another aspect there is provided a method of making a micro mirror consisting of a body having a mirror support portion, opposed anchor portions and flexible hinge portions which connect the mirror support portion to the anchor portions, in which combs on the mirror support portion interact with combs on the anchor portions. A first step involves using photolithography and partial silicon etching to form an upper portion of the mirror support portion, an upper portion of the opposed anchor portions, an upper portion of the hinge portions and a pair of upper combs in a silicon wafer. A second step involves bonding the partially etched silicon wafer to a carrier wafer. A third step involves using photolithography and partial silicon etching to form a lower portion of the mirror support portion, a lower portion of the opposed anchor portions, a lower portion of the hinge portions arid a pair of lower combs in the silicon wafer.

BRIEF DESCRIPTION OF THE DRAWINGS

These and other features of the invention will become more apparent from the following description in which reference is made to the appended drawings, the drawings are for the purpose of illustration only and are not intended to in any way limit the scope of the invention to the particular embodiment or embodiments shown, wherein:

FIG. 12b is a detailed perspective view of full pattern of buried oxide of SOI in FIG. 12a.

FIG. 17b is a detailed perspective view of the bonded wafer illustrated in FIG. 17a.

FIG. 18b is a detailed perspective view of the bonded wafer illustrated in FIG. 18a.

FIG. 19b is a detailed perspective view of the bonded wafer illustrated in FIG. 19a.

FIG. 20b is a detailed perspective view of the bonded wafer illustrated in FIG. 20a.

FIG. 21b is a detailed perspective view of the final micro mirror device illustrated in FIG. 21a.

DETAILED DESCRIPTION

Figure 1:
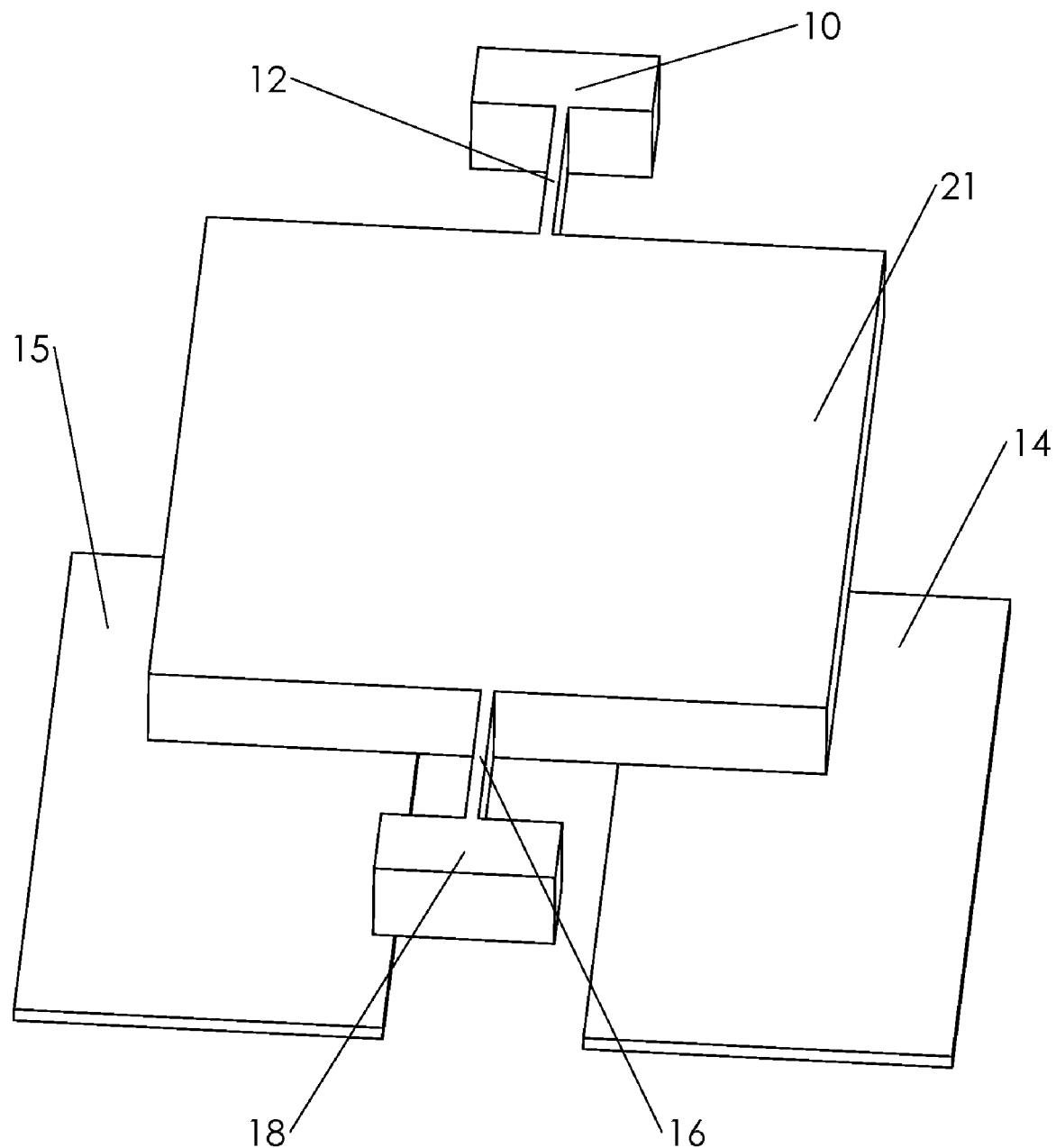
FIG. 1, labeled as PRIOR ART, is a perspective view of a micro mirror using a parallel plate type of electrostatic actuator.

The preferred embodiment, a MEMS micro mirror generally identified by reference numeral 21, will now be described with reference to FIG. 1 through 22b.

While this invention is susceptible of embodiments in many different forms, there is shown in the drawing and will herein be described in detail, preferred embodiment of the invention with the understanding that the present disclosure is to be considered as an exemplification of the principles of the invention and is not intended to limit the broad aspects of the invention to the embodiments illustrated. The figures are not necessarily drawn to scale and relative sizes of various elements in the structures may be different than in an actual device.

One of prior art of micromirrors with parallel plate actuators is shown in FIG. 1. The mirror 21 coated with reflective materials such as metal film are supported by two hinges 12 and 16 which are connected to the anchors 10 and 18. Two fixed actuation electrodes 14 and 15 are located below the mirror 21. The mirror, hinges and anchors can be made of heavily doped electrical conductive silicon. When the actuation voltage is applied between mirror 21 and electrode 14, the resulting electrostatic force will pull the mirror 21 towards electrode 14 and cause the deformation of the hinges. When the electrostatic force is balanced with the mechanical restoring force of the deformed hinges, the mirror 21 will stabilize. The previously described disadvantages of the parallel plate electrostatic actuator such as pull-in effect, tilting angle drifting and squeezed air damping, lead to poor performance of the micro mirror. In addition, the parallel plate electrostatic actuator uses a very complex, low yield and expensive manufacturing method.

Figure 2:
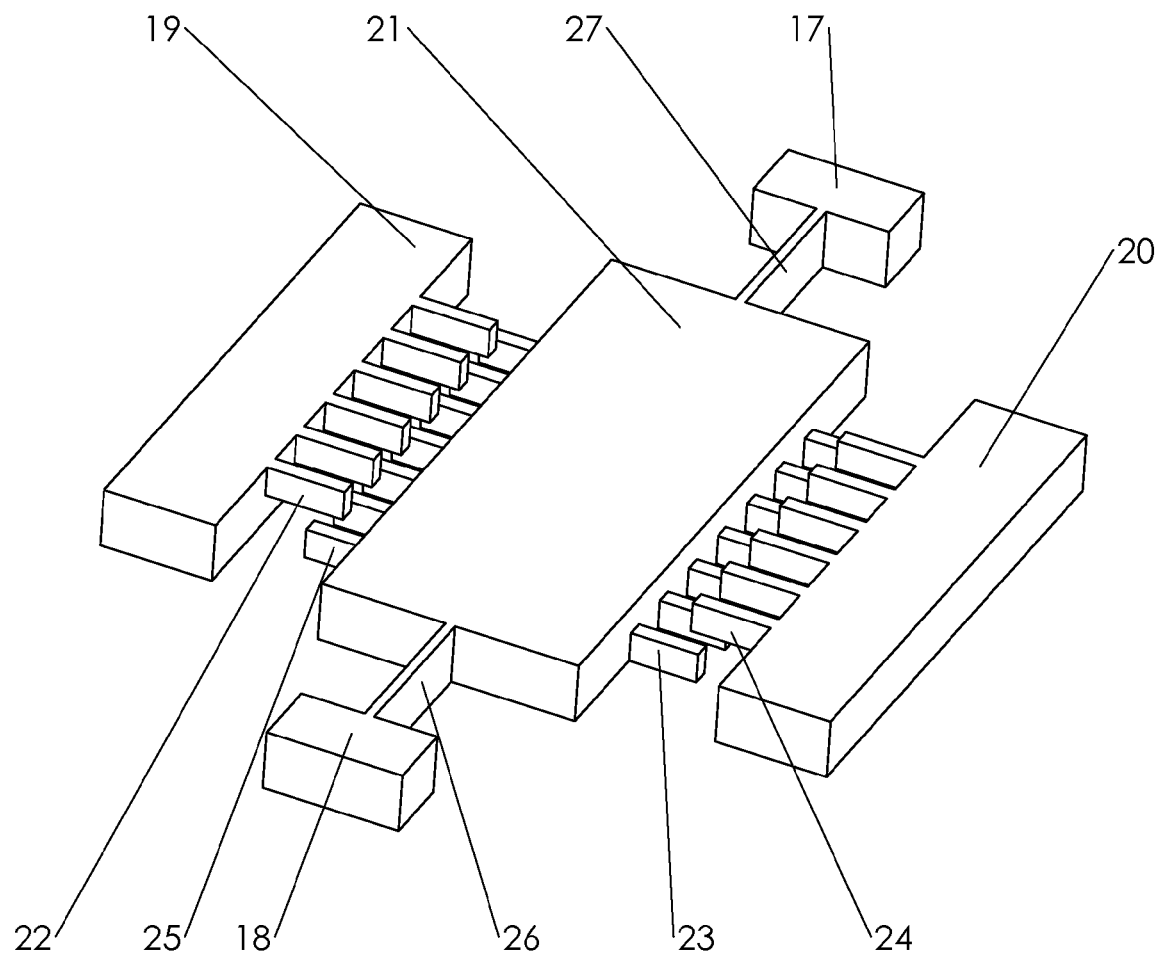
FIG. 2 is a perspective view of a micro mirror using electrostatic vertical combdrive actuators with two directional rotations.

A vertical electrostatic combdrive is shown in FIG. 2. The advantages of the vertical combdrive over the parallel plate electrostatic actuator are higher actuation force density, better actuation linearity, no pull-in effects. The micromirror design and fabrication of the micromirror in the present invention eliminate tilting angle drifting and squeezed air damping. The micromirror 21 is fixed to the anchors 17 and 18 through hinge 26 and 27. The fixed electrodes 19 and 20 have fixed upper comb finger 22 and 24. The movable lower comb finger 23 and 25 are on the outside edges of the mirror 12. When an actuation voltage is applied between the moveable finger 23 and fixed comb finger 24, the resulting electrostatic force will pull the mirror 21 anticlockwise around the hinge 26 and 27, and causes the hinge 26 and 27 to deform. The mirror will reach a stable position when the electrostatic force is balanced with the resulting mechanical restoring force of the deformed hinges 26 and 27. If the actuation voltage is applied between fixed upper comb finger 22 and movable comb finger 25, the mirror 21 will rotate around the hinge 26 and 27 clockwise.

The present invention uses different upper and lower finger designs to achieve the direction control of the mirror rotation. The vertical combdrive design shown in FIG. 2 has two fixed electrodes 19 and 20, if the micromirror 21 is electrically grounded, the applied voltage on any of fixed electrodes 19 and 20 can independently rotate the mirror tilt into two different directions, either clockwise or anticlockwise.

Figure 3:
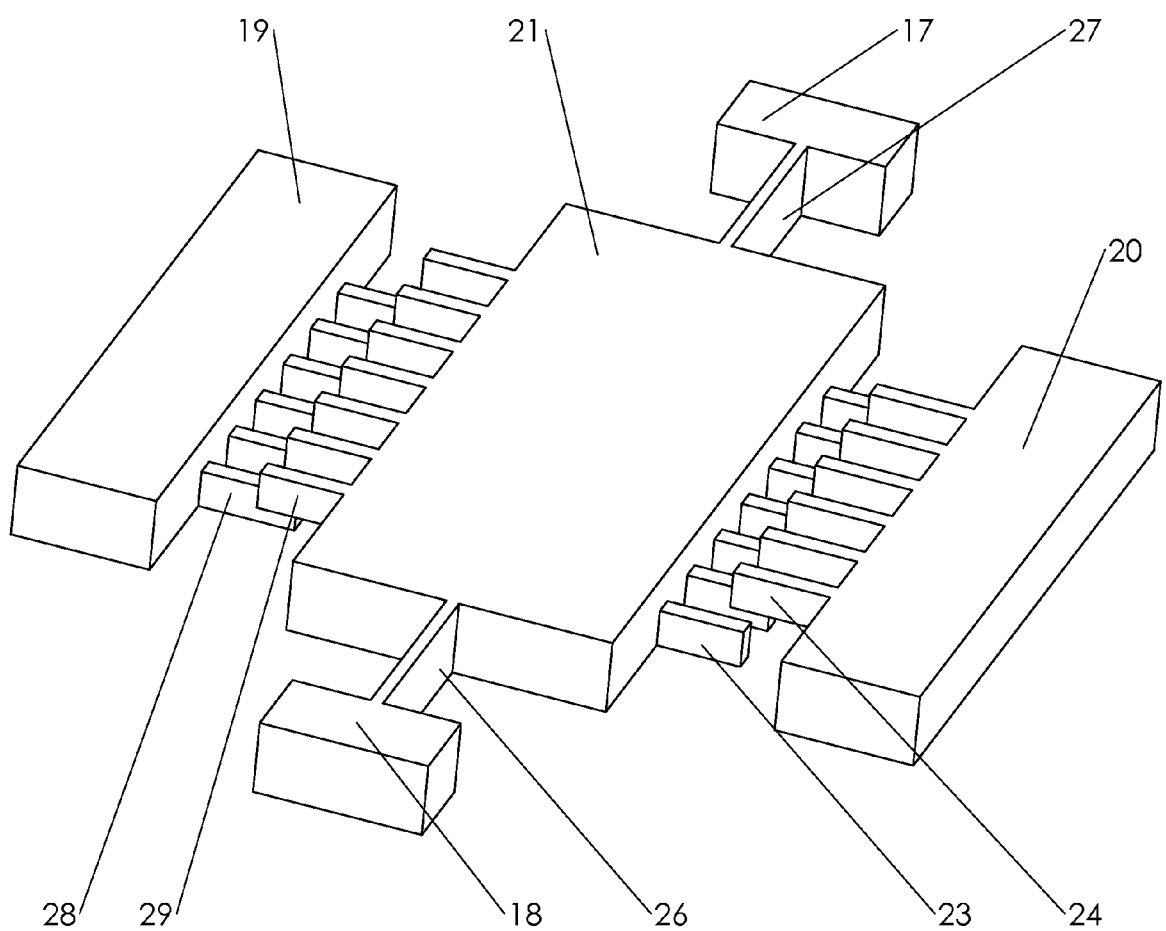
FIG. 3 is a perspective view of a micromirror using electrostatic vertical combdrive actuators with one directional rotation.

The vertical combdrive design shown in FIG. 3 has different upper and lower comb finger arrangement. The mirror 21 has upper comb fingers 29 and lower fingers 23 on its outside edges. The fixed electrode 19 has fixed lower comb fingers 28, while fixed electrode 20 has fixed upper comb fingers 24. When the mirror 21 and associated upper fingers 29 and lower fingers 23 are electrical grounded, if an electrically potential is applied on fixed electrodes 19 and 20 at the same time, the mirror will rotate anticlockwise. The combdrives on both side edges of the mirror 21 will work together to actuate the mirror in the same direction. The advantages of such design are the reduction of the actuation voltage for certain mirror tilting angle, and eliminating the resulting unbalanced force on the hinges, which can cause the up or down piston movement of the mirror besides desired mirror rotation.

The following process description gives the microfabrication method and design of micromirror. Although there are many other alternative microfabrication methods, we only give the representative fabrication method for the micromirror and vertical combdrive structure. The micromirror and vertical combdrive actuator structure designs will remain the same in the present invention. Only the major process steps for fabricating the micromirror device will be described.

Figure 4:
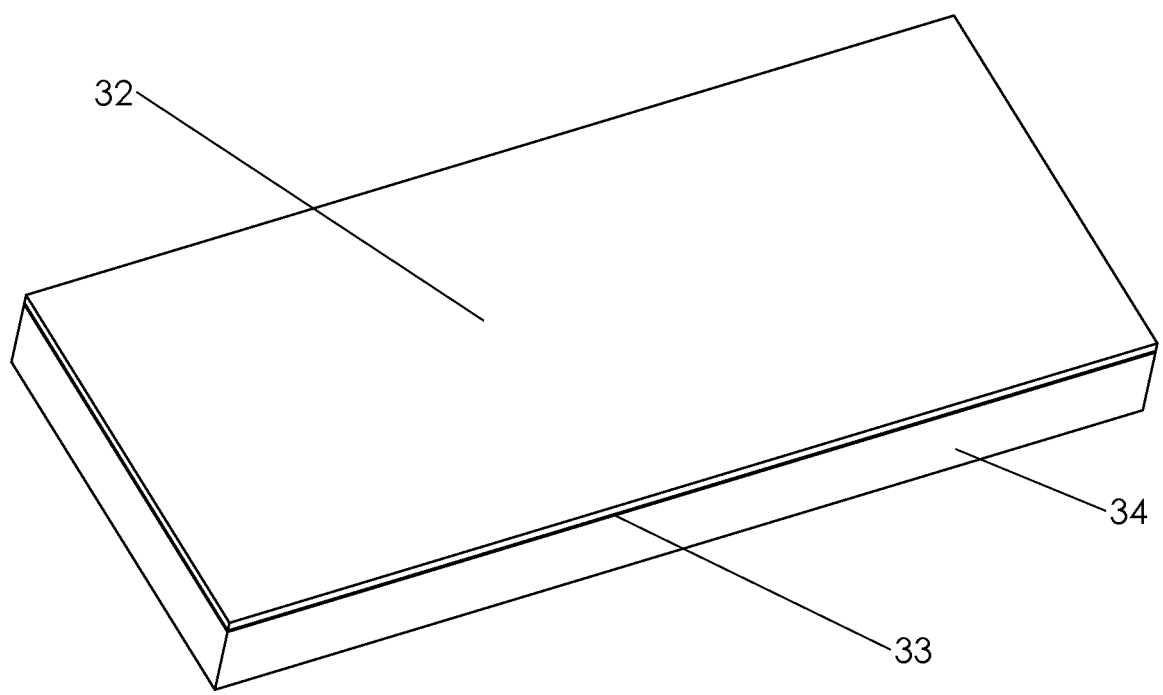
FIG. 4 is a perspective view of a Silicon On Insulator (SOI) wafer.

The micromirror and corresponding vertical combdrive actuators are made of the single crystal device silicon of Silicon On Insulator (SOI) wafer shown in FIG. 4. Relative thinner single crystal device silicon layer 32 is bonded to handle silicon wafer 34 with Buried Oxide (BOX) 33. This starting material SOI wafer can be directly purchased from SOI wafer vendors, or some well known method such as fusion bonding and etching back process can be used to make such material. The single crystal device silicon should be heavily doped to have good electrical conductivity. The reason for using single crystal silicon for micromirror is its residual stress free and excellence mechanical material properties as well as optical quality surface finish.

Figure 5:
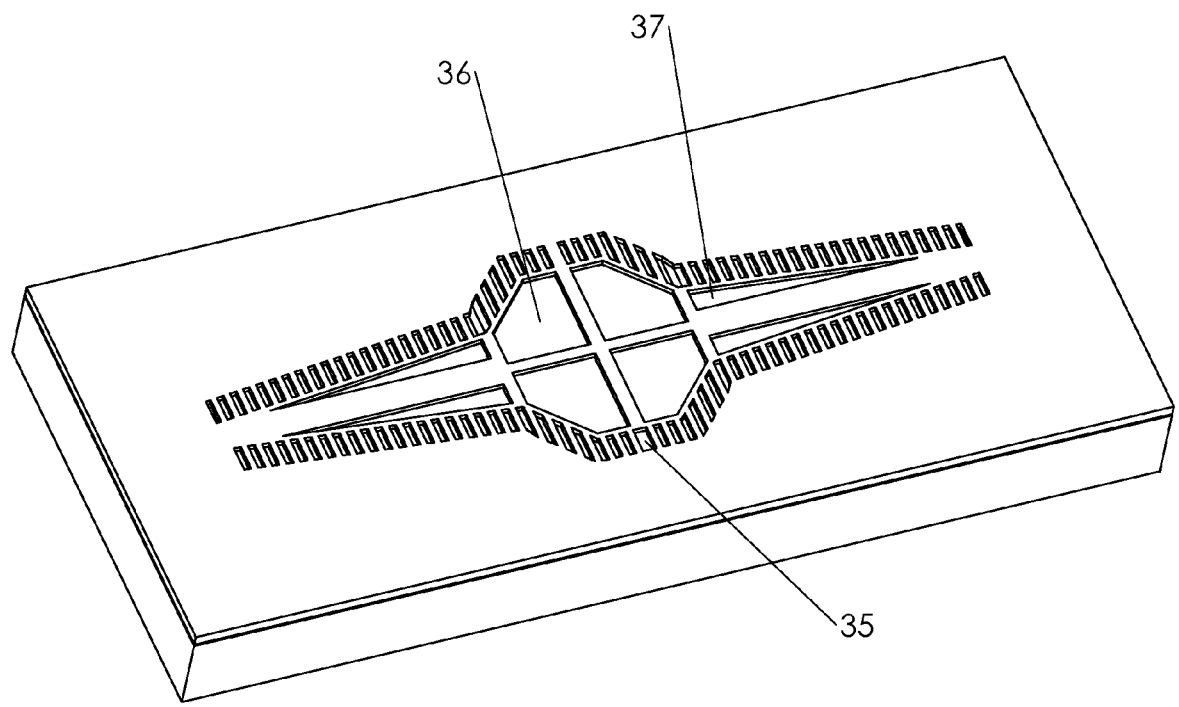
FIG. 5 is a perspective view of Silicon On Insulator (SOI) wafer after Deep Reactive Ion Etching (DRIE).

A photolithography process is performed on the single crystal silicon layer for the subsequent partial silicon Deep Reactive Ion Etching (DRIE). The DRIE etch depth can be around half thickness of the single crystal silicon, for example. The purposes of partial silicon DRIE are multiple. In FIG. 5, silicon DRIE in region 35 is to remove the part of silicon materials to form upper vertical comb fingers, while the silicon DRIE in regions 36 and 37 are on the backside the micromirror and actuation arm respectively. The partial silicon etching reduces the masses of the micromirror and actuation supporting arms and increases micromirror's resonant frequency without sacrificing the mirror and actuation supporting arm structure strength and mirror flatness etc. The partial silicon DRIE etch can also be used to thin down the hinge heights to make them more flexible, therefore less actuation voltage is required.

Figure 6:
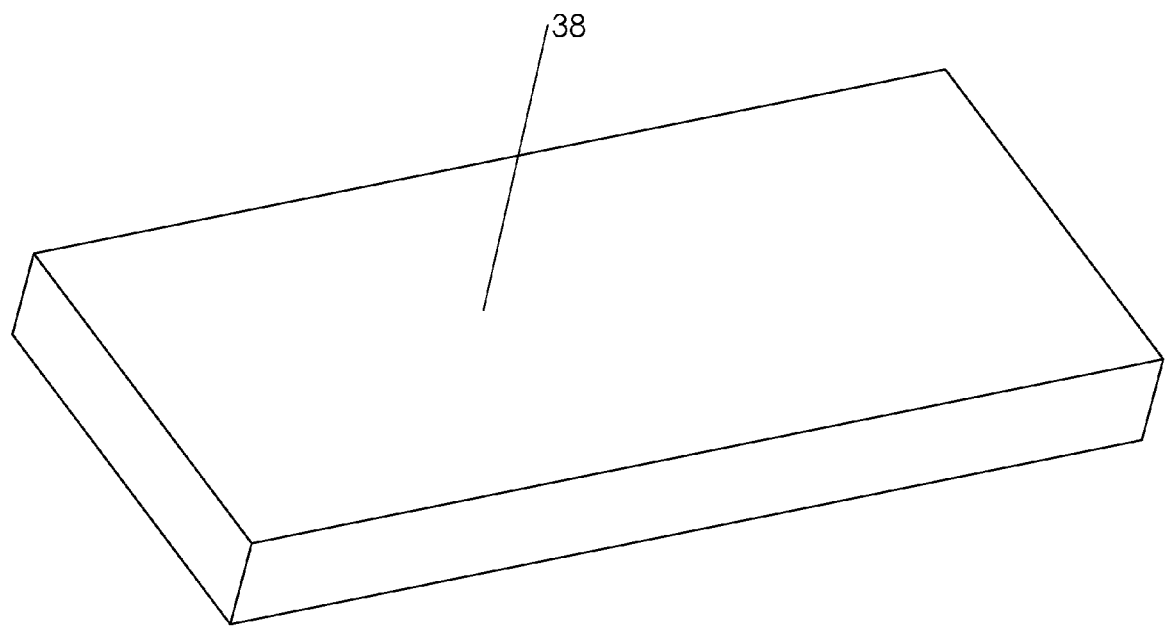
FIG. 6 is a perspective view of a carrier wafer.

A handle or carrier wafer 38 shown in FIG. 6 could be Pyrex glass or regular silicon wafer. After forming some supporting structures to support the anchor of vertical combdrive actuators, and a deep cavity under micromirrors to reduce or eliminate the squeezed air damping, the carrier wafer 38 will be bonded to the SOI wafer by using either fusion bonding, anodic bonding or other bonding techniques.

Figure 7:
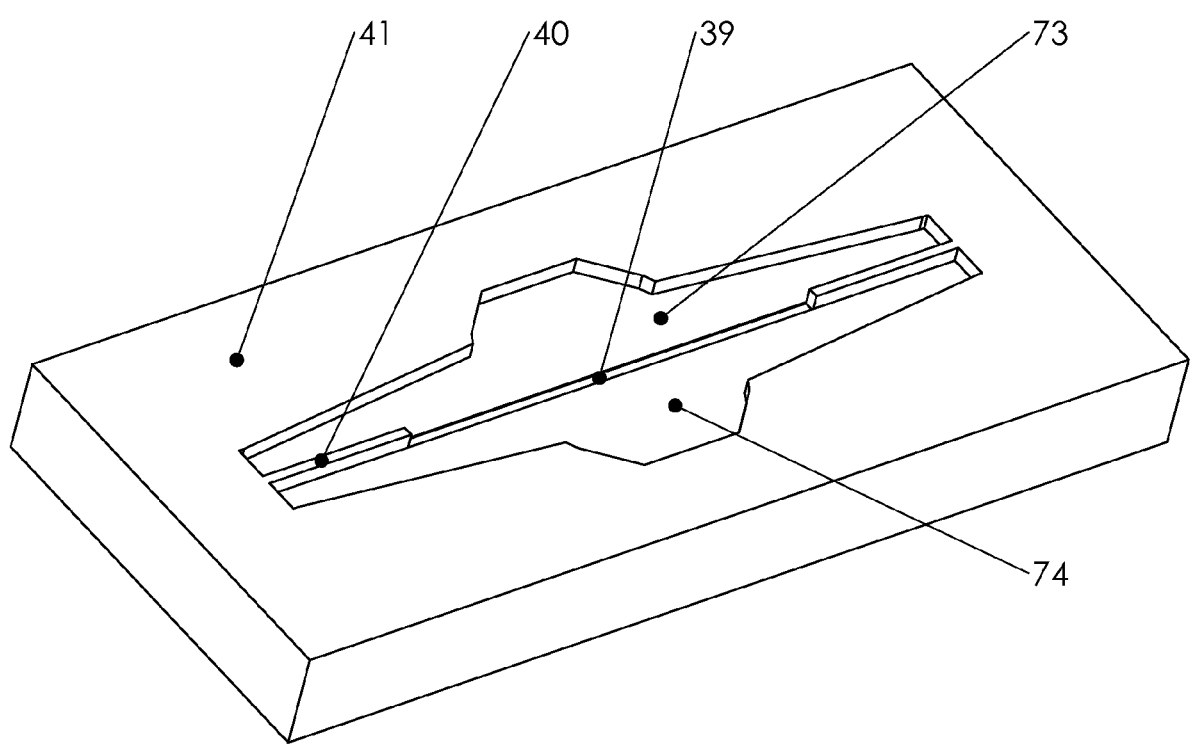
FIG. 7 is a perspective view of a silicon carrier wafer after silicon etching to form a supporting structure and cavity.

In FIG. 7, if the carrier wafer 38 is a regular silicon wafer, the lithographies and silicon DRIE will be conducted to form the supporter 40 and the a deep cavity 39 under the micromirror by DRIE, or simply etching through the carrier wafer to leave a hole under the micromirror. Other etching methods can also be applied for this etching such as wet silicon anisotropic etching in potassium hydroxide (KOH) or tetramethylammonium hydroxide (TMAH) etc. After silicon etching and before fusion bonding with SOI wafer, a very thin thermal oxide 41 will grow on the carrier silicon wafer in order for single crystal silicon device layer of SOI to have electrical isolation with the carrier silicon wafer.

Figure 8:
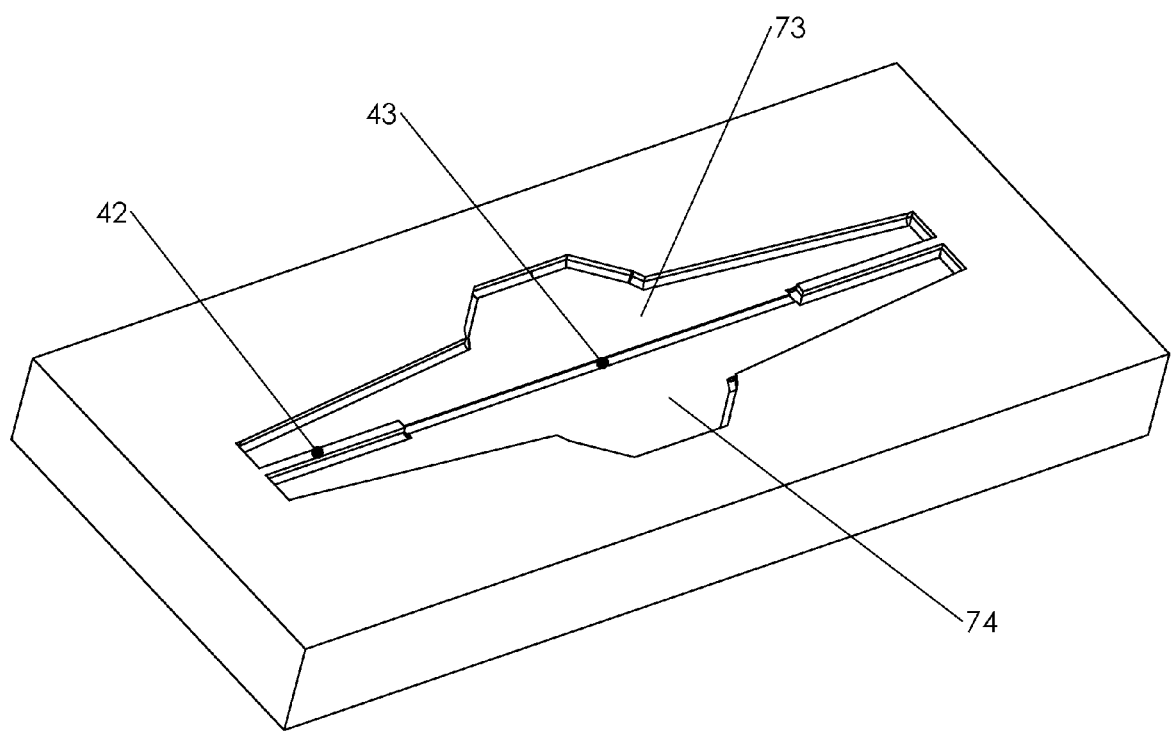
FIG. 8 is a perspective view of a glass carrier wafer after glass etching to form supporting structure and cavity.

If Pyrex glass is chosen as the carrier wafer, the isotropic glass etching in hydrofluoric acid (HF) will form the supporters 42 and a deep cavity 43 by glass etching in FIG. 8. Through hole under micromirror on the glass carrier wafer can be formed to further reduce the air damping. The through hole can be made using wet HF etching, simply sand blasting or laser micromaching from back side of the glass carrier wafer.

Referring to FIG. 7 and FIG. 8, for some applications such as optical VOA (Variable Optical Attenuator), certain squeeze air damping is required to reduce the stabilizing time of the mirror during switching mirror positions; also the low driving voltage has high priority. For such applications, a thin metal film, identified by reference numerals 73 and 74 is deposited and patterned on the bottom of shallower cavities 39 and 43. A part 73 of the patterned metal film is forming the bottom driving electrode to pull the micromirror downwards, similar to the design in FIG. 1. This extra actuation force will help vertical combdrives to further reduce the total actuation voltage of the micromirror. The other part 74 of patterned metal film, which is often electrically connected to the micromirror, is used to shield exposed glass or thin thermal oxide 41 facing the micro mirror. Otherwise, accumulated charging on these dielectrical materials can cause undesirable titling angle drifting.

Figure 9:
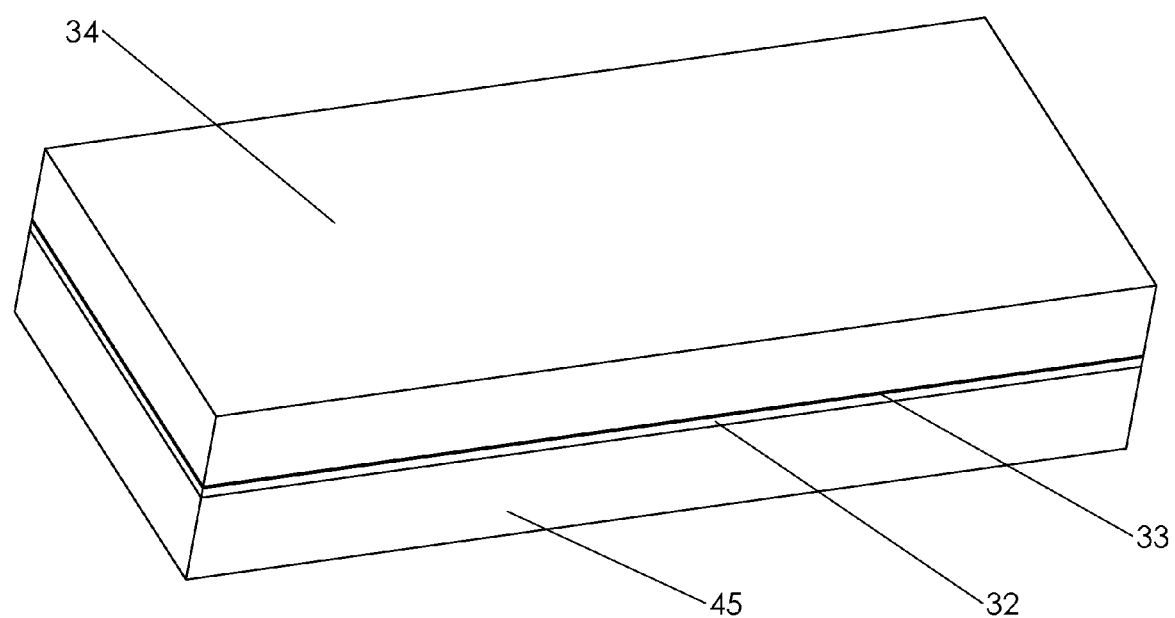
FIG. 9 is a perspective view of SOI wafer bonded with carrier wafer.
Figure 10:
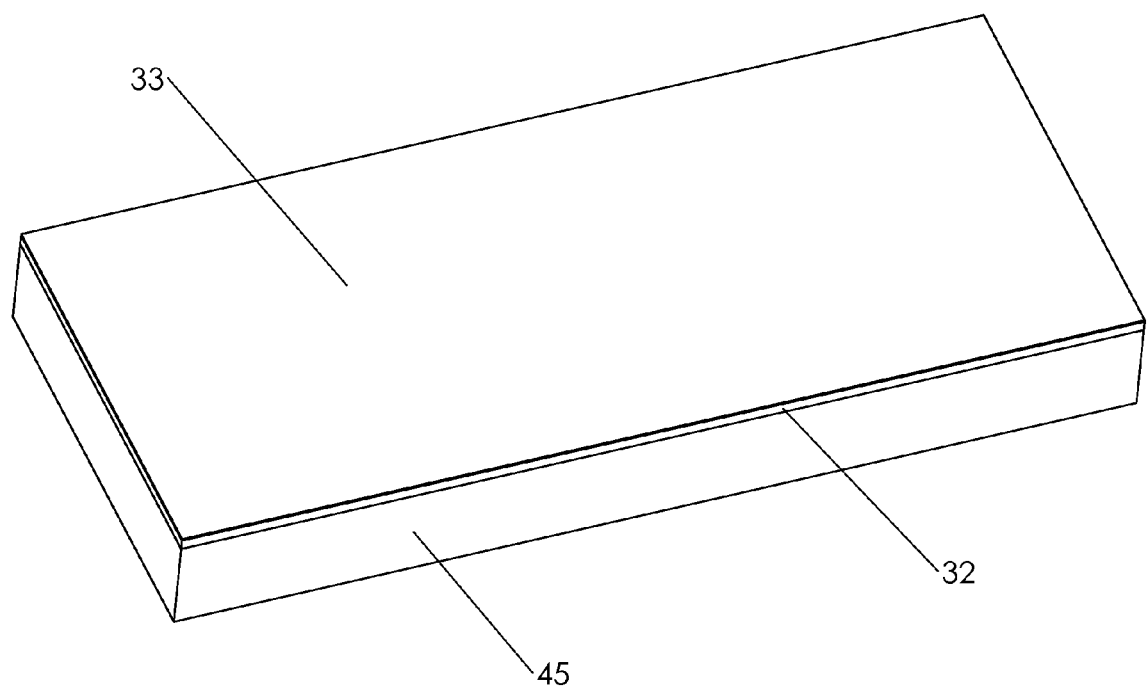
FIG. 10 is a perspective view of bonded wafer after etched away handle wafer of SOI.

The SOI wafer is bonded to the Pyrex glass carrier wafer 45 using anodic bonding shown in FIG. 9. If the Pyrex glass carrier wafer has through etched holes under the location of the mirror, this wafer should be protected on the glass side during the SOI handle wafer removal in the KOH or TMAH bath to prevent the enchant from attacking the device silicon of SOI wafer through the hole on the glass carrier wafer. The protection method can be as simple as using wafer protection holder which seals the whole glass wafer and only expose the handle wafer 34 of the SOI wafer in the KOH or TMAH bath. If the glass carrier wafer only has deep etching cavity under micromirror, there is no need to have extra protect since the glass wafer 45 itself will provide good protection to single crystal silicon device layer during KOH or TMAH silicon etching. The buried oxide layer 33 of SOI wafer is used as the etching stop layer for KOH or TMAH silicon etching. The bonded wafer after SOI handle wafer removal is shown in FIG. 10.

It is very critical to have actuation stability of vertical combdrive actuator. The self alignment process is applied to achieve the equal gap between adjacent comb fingers. Any unequal gap between adjacent comb fingers will cause asymmetry of electrostatic force, which in turn results in the malfunction of the vertical combdrive such as sideway snapping movement of movable comb fingers.

Figure 11:
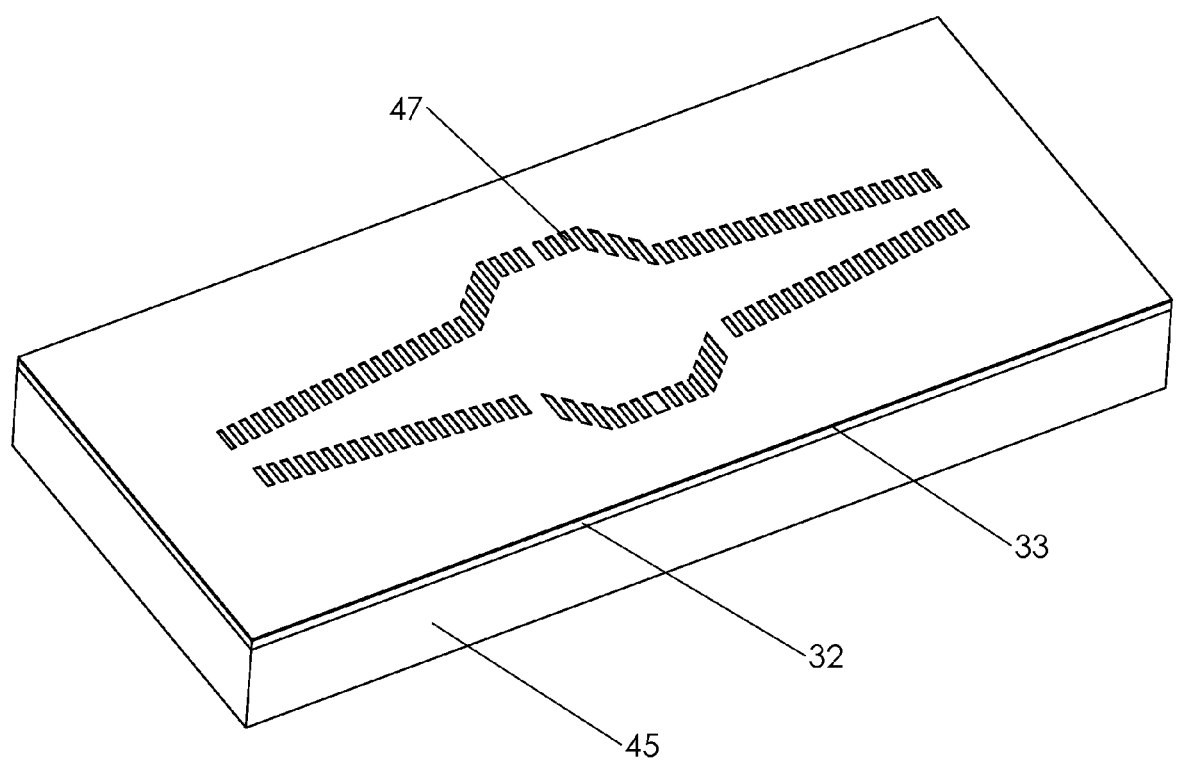
FIG. 11 is a perspective view of partial etching of buried oxide of SOI.

The Buried Oxide layer 33 shown in FIG. 11 is kept and used as silicon DRIE etching masking materials for the self alignment process. After photolithograph, the partial RIE (Reactive Ion Etch) etching of buried oxide layer is done to make preparation for making etching masking layer of lower comb fingers. The oxide partial etching region 47 is shown in FIG. 11.

Figure 12A:
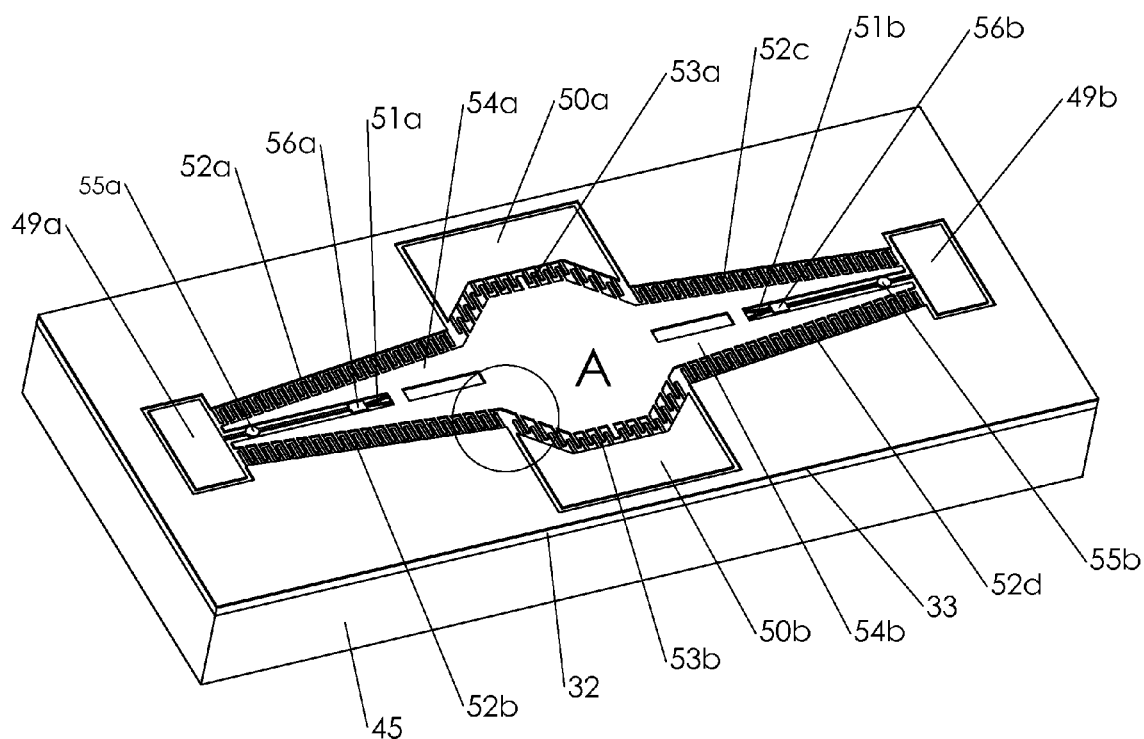
FIG. 12a is a perspective view of full pattern of buried oxide of SOI.
Figure 12B:
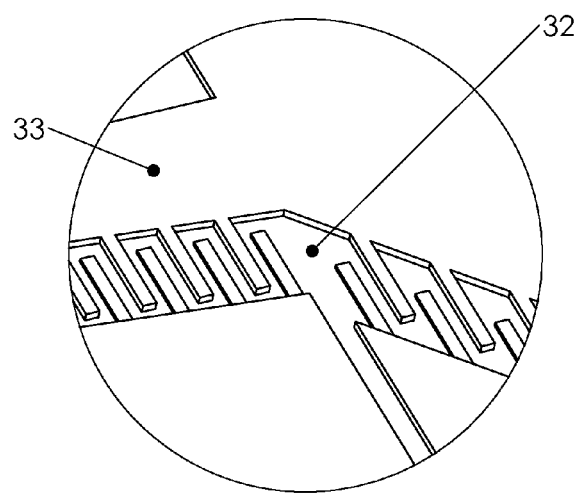

A subsequent photolithograph is done after the partial oxide etching; a layer of photoresist is coated on the wafer for the patterning. Since the total thickness of buried oxide layer is only a couple of micron, there is no high topography issue for photolithography, and high photolithography resolution can be maintained. After this photolithography, an oxide RIE is performed to have buried oxide patterns of hinges 51a and 51b, hinge anchors 56a and 56b, primary vertical combdrive actuators 52a, 52b, 52c and 52d, and monitoring vertical combdrive finger bank 53a and 53b for the detection of the mirror position, arms 54a and 54b for the primary vertical combdrive actuator, bonding pads 49a, 49b, 50a and 50b as well as mechanical stops 55a and 55b. The mechanical stops 55a and 55b are used for preventing the undesirable over displacement under the certain environments such as accidental shock (FIG. 12a). In the detailed view of FIG. 12b, the upper comb finger has full thickness of buried oxide 33 as DRIE etching mask layer, while the lower comb finger has only partial thickness of the buried oxide 33 as DRIE etching mask layer.

The tapered shape of the supporting arms has advantage of reducing the undesirable side way micromirror rotation. Also the location of the hinges are located far away from the micromirror, the purpose is also to suppress the undesirable side way micromirror rotation.

Figure 13:
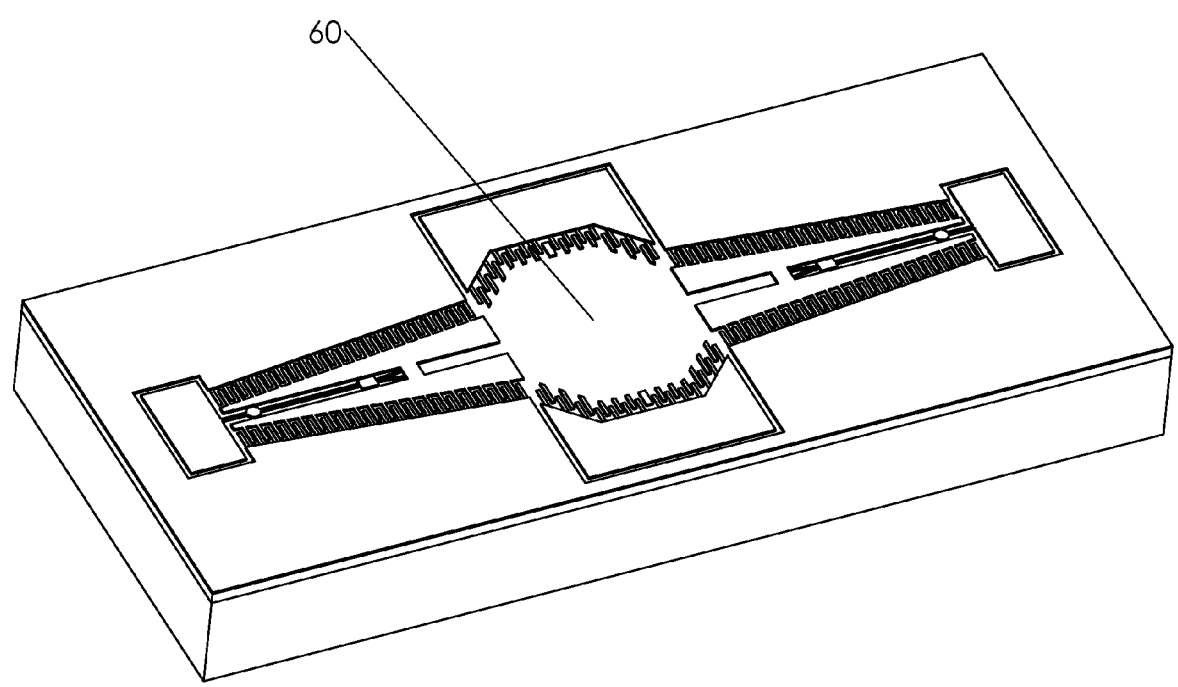
FIG. 13 is a perspective view of buried oxide of SOI after etching away the oxide in the mirror location.
Figure 14:
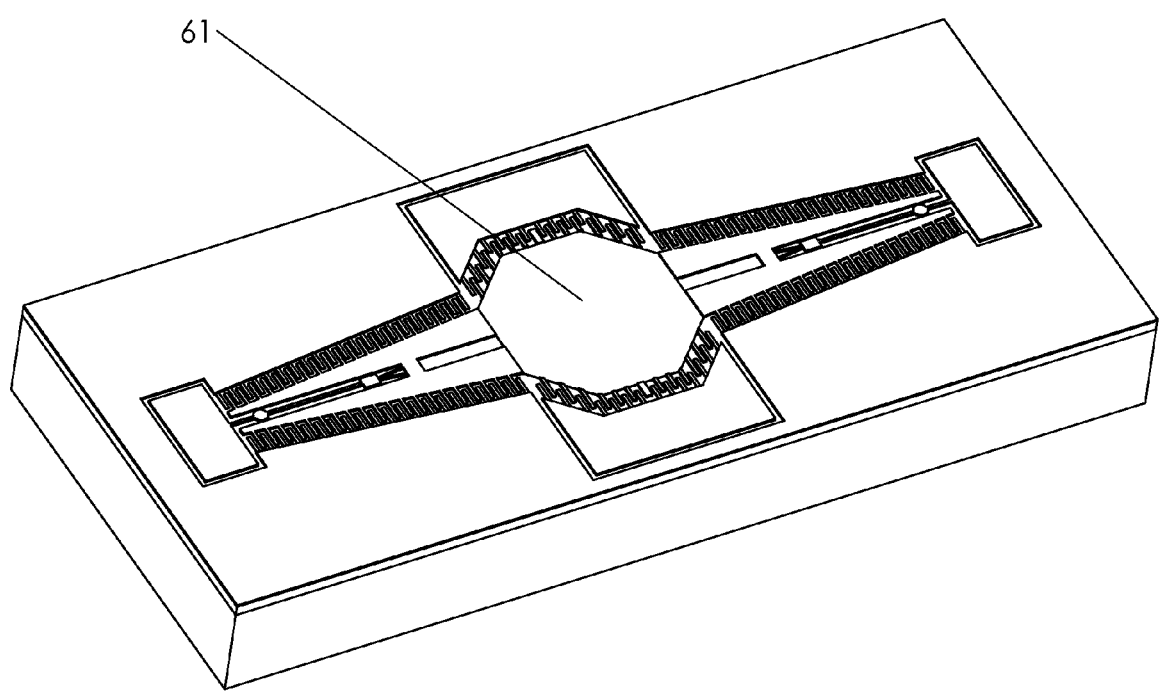
FIG. 14 is a perspective view of the bonded wafer after deposition and patterning of low stress and thin reflective metal film on the top of the mirror.

In order to have the good reflectivity of the mirror surface, a reflective metal film such as gold film is deposited on the mirror surface. The low stress metal film is required since high metal film stress can cause the undesirable higher Radius of Curvature (ROC) of the mirror. Usually a very thin layer of metal film with low residual stress is applied. FIG. 13 shows that buried oxide 33 in the mirror region 60 is etched away using standard photolithographic patterning and etching process. FIG. 14 shows that a very thin layer of metal film 61 with low residual stress is applied on the top of silicon mirror.

Figure 15:
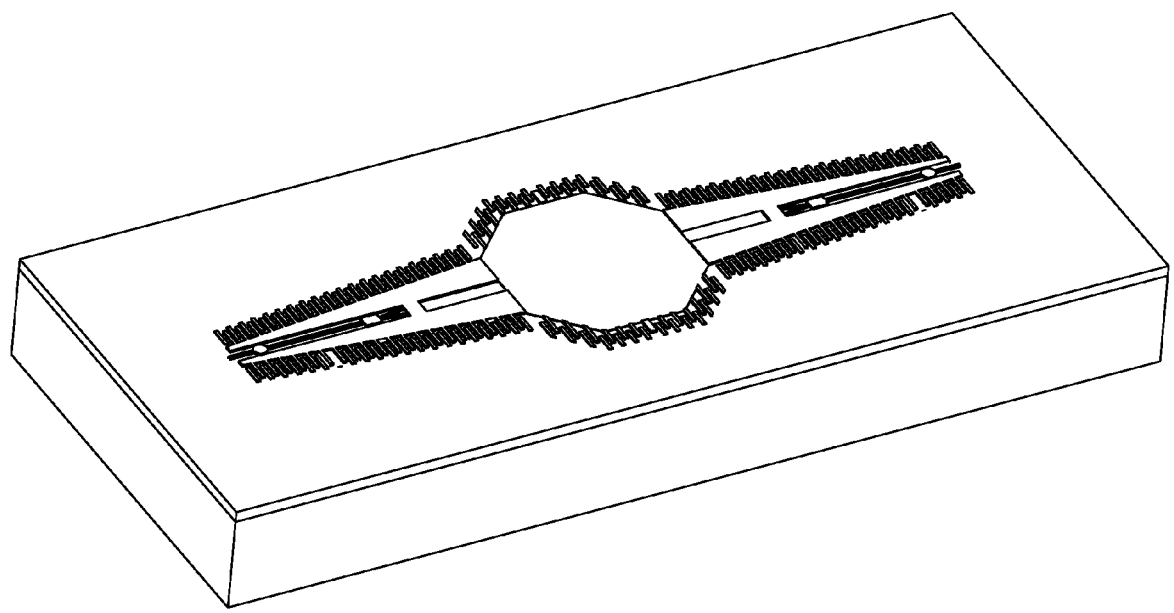
FIG. 15 is a perspective view of buried oxide of SOI after etching away the oxide in the areas of bonding pads and electrical connection.
Figure 16:
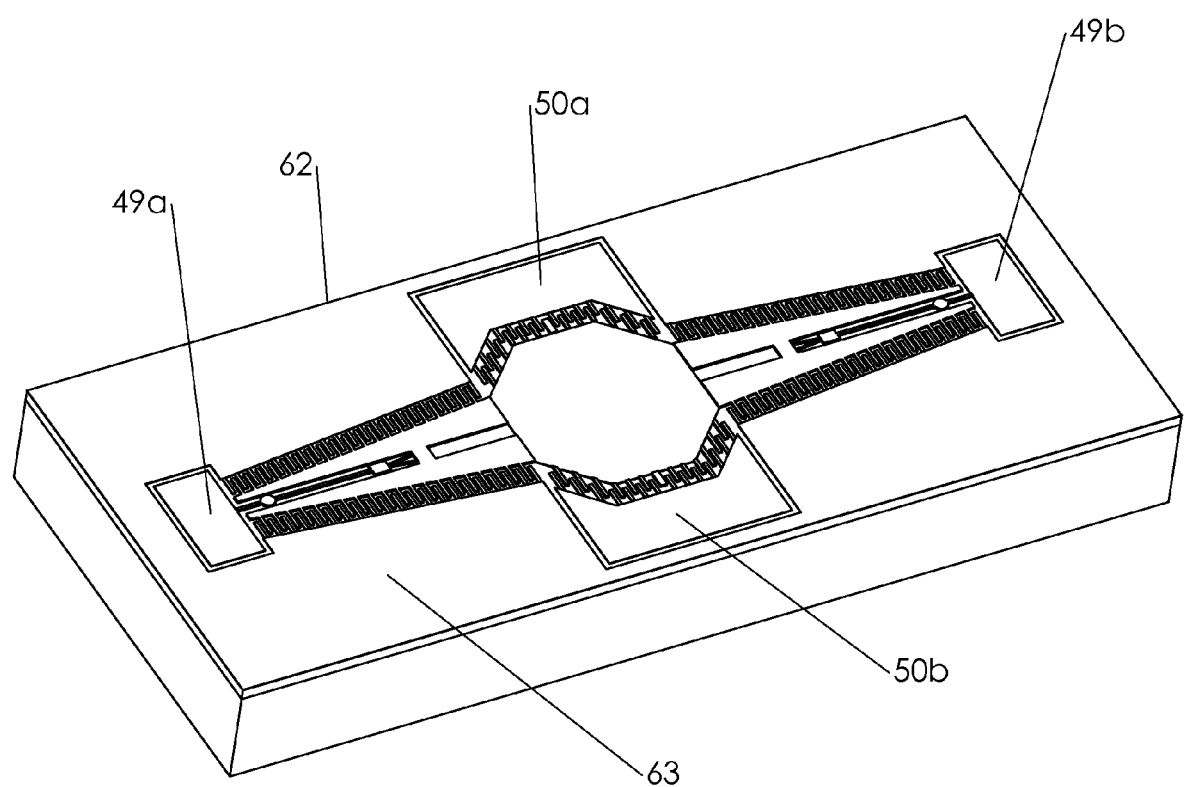
FIG. 16 is a perspective view of the bonded wafer after deposition and patterning of thicker metal film on the top of the bonding pads and electrical connection area.

The thicker metal film is required on the bonding pads and areas for electrical connections. This thicker metal film with low electrical resistance could have some residual film stress since the bonding pads and electrical connection areas are not very sensitive to the residual thin film stress. FIG. 15 shows that buried oxide 33 in the bonding pads and electrical connection areas are etched away using standard photolithographic patterning and etching process. FIG. 16 shows that a thicker layer of metal film 62 with some residual stress is applied on the top of bonding pads 49a, 49b, 50a, 50b and electrical connection area 63.

Figure 17A:
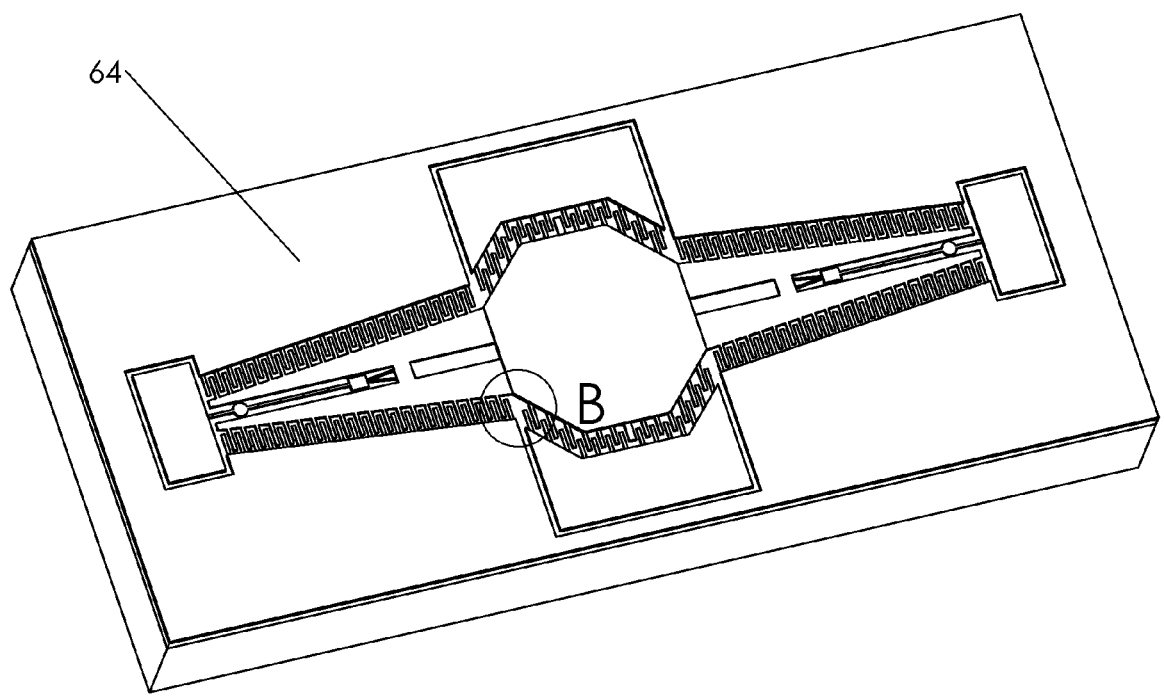
FIG. 17a is a perspective view of the bonded wafer after deposition and patterning of thicker photoresist on the top of the metal films.
Figure 17B:
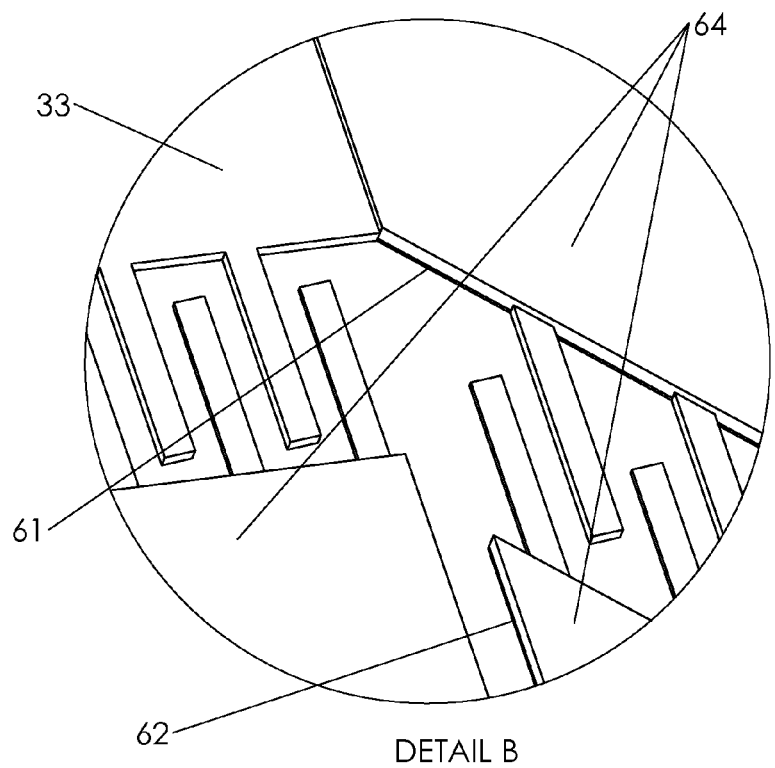

Before DRIE releasing the micromirror and forming lower and upper comb fingers, all the metal films on the micro mirror, bonding pads and electrical connection area should be protected from strong plasma etching during DRIE etching. The very thick layer of photoresist 64 is coated and patterned on the wafer using standard lithography process (FIG. 17a). The higher resolution of photolithography is not required since patterned photoresist is only used for the etching protection. In the detailed view in FIG. 17b, the thin metal film 61 and thicker metal film 62 are under the thicker photoresist 64. The comb fingers with buried oxide on the tops have no thick photoresist protection.

Figure 18A:
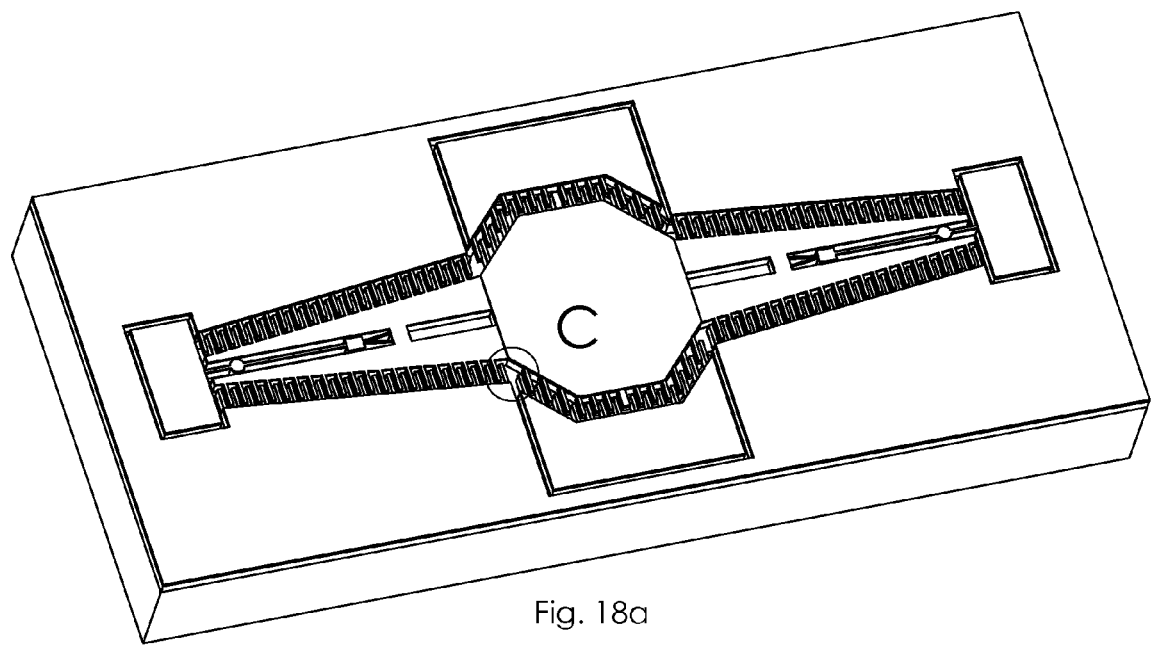
FIG. 18a is a perspective view of the bonded wafer after DRIE etching through device silicon of SOI wafer.
Figure 18B:
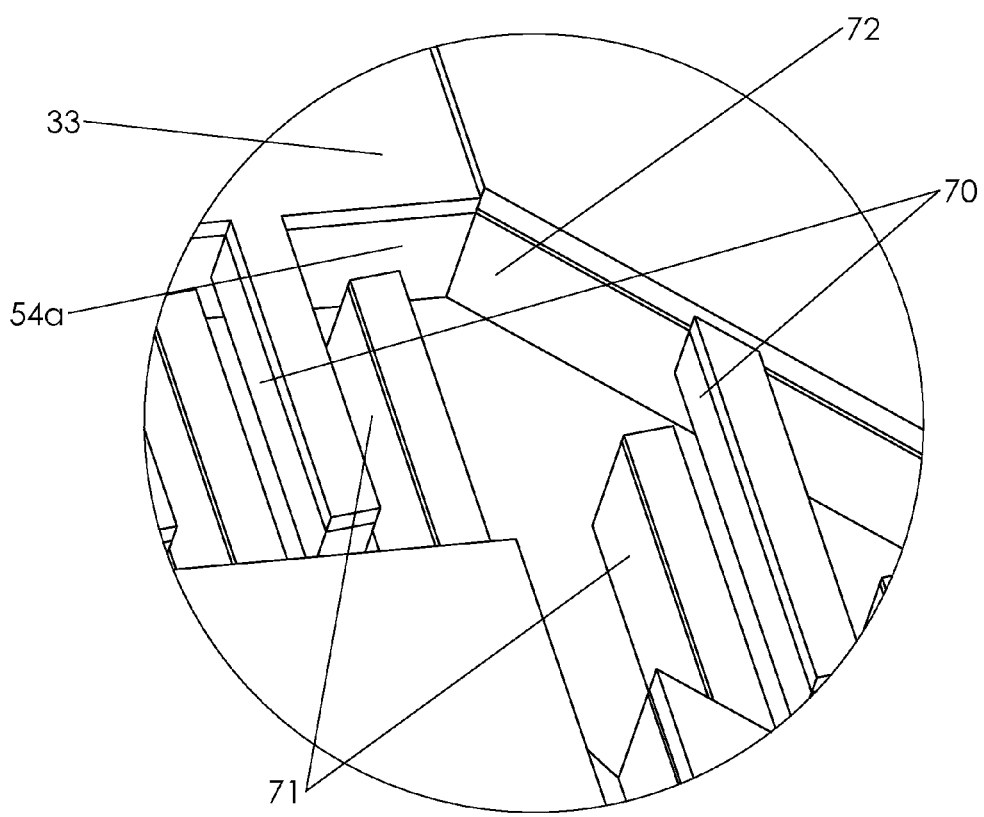
Figure 19A:
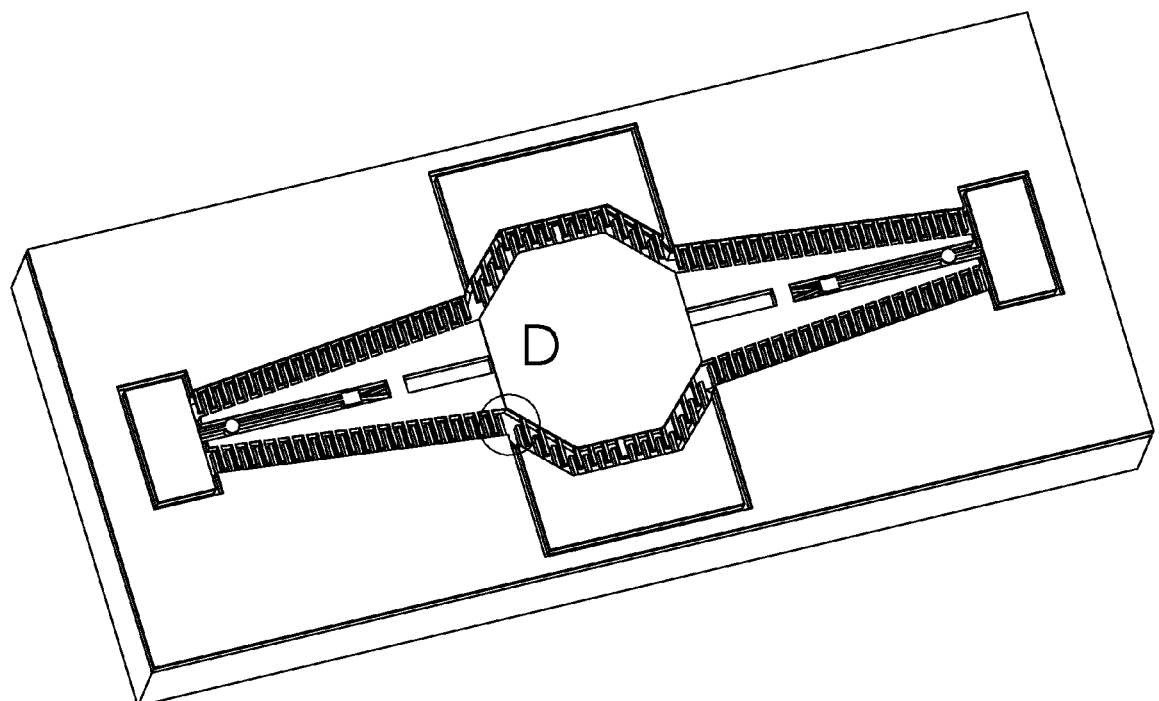
FIG. 19a is a perspective view of the bonded wafer after RIE (Reactive Ion Etching) etching away the buried oxide on top of the lower comb fingers.
Figure 19B:
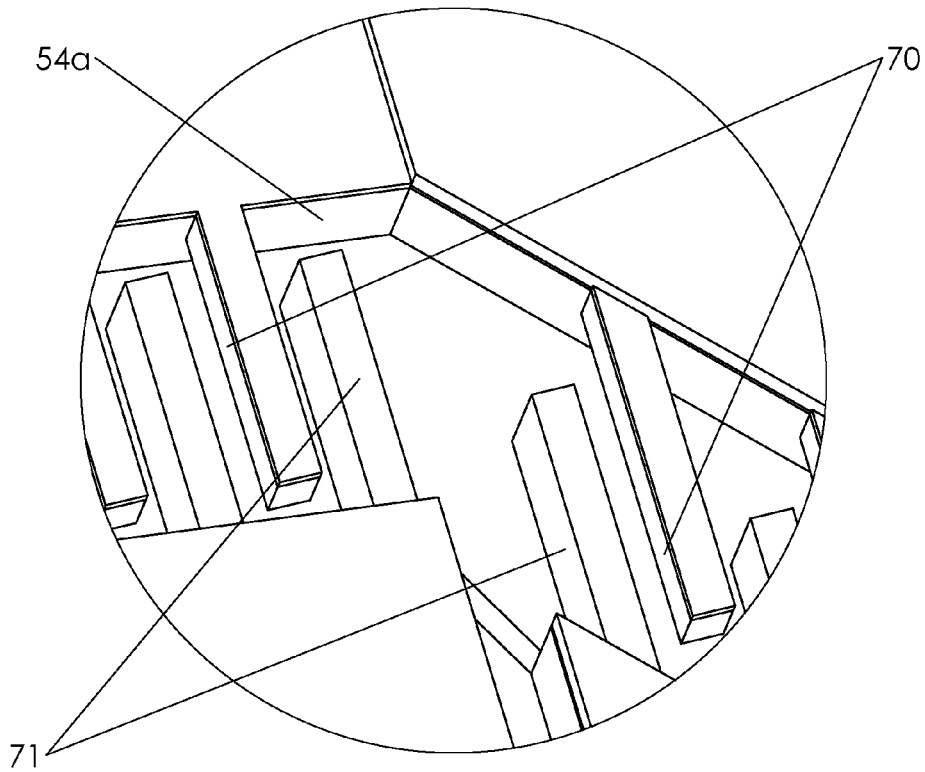
Figure 20A:
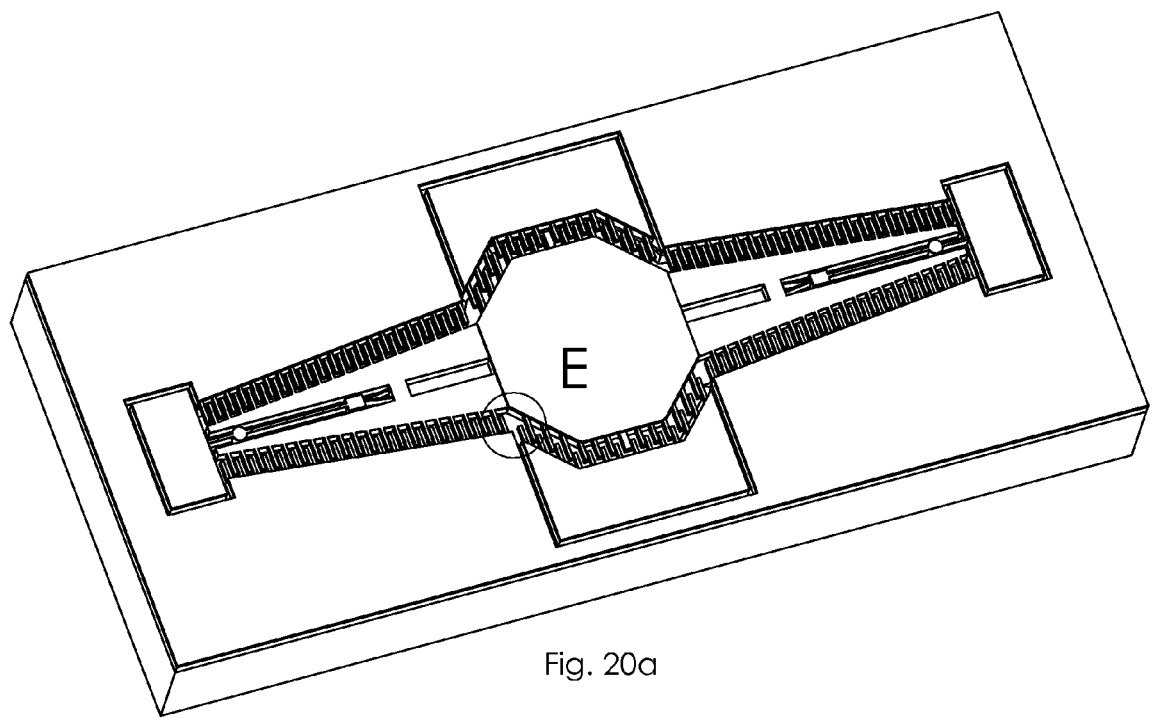
FIG. 20a is a perspective view of the bonded wafer after DRIE etching to form the lower comb fingers.
Figure 20B:
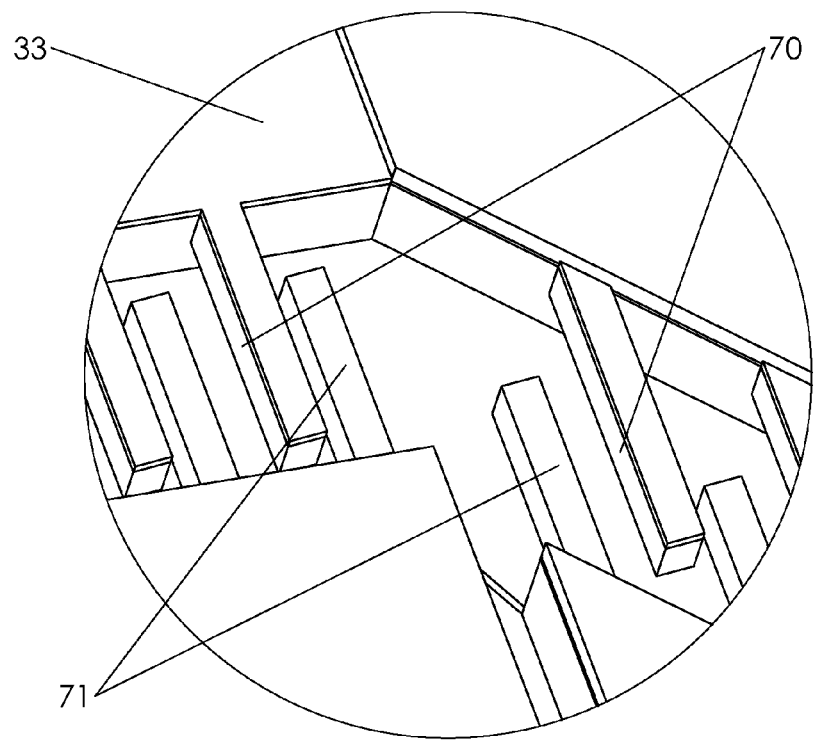

The silicon DRIE etching is used to etch through the single crystal device silicon 34 as show in FIG. 18. The micro mirror 72 is released to be free. In the detailed view in FIG. 18b, the upper comb finger 70 and arms 54a have thicker buried oxide left on the tops, while lower comb fingers 71 have thinner buried oxide left on the top. Again the hinges 51a and 51b, anchors 56a and 56b and mechanical stops 55a and 55b have thicker buried oxide left on the tops.

A subsequent oxide RIE is utilized to etch away any remaining oxide on the lower finger 71 (FIG. 19), while the upper comb fingers 70, arms 54, hinges 51, anchors 56, mechanical stops 55 still have some remaining buried oxide (FIG. 19b) left on the tops.

Figure 21A:
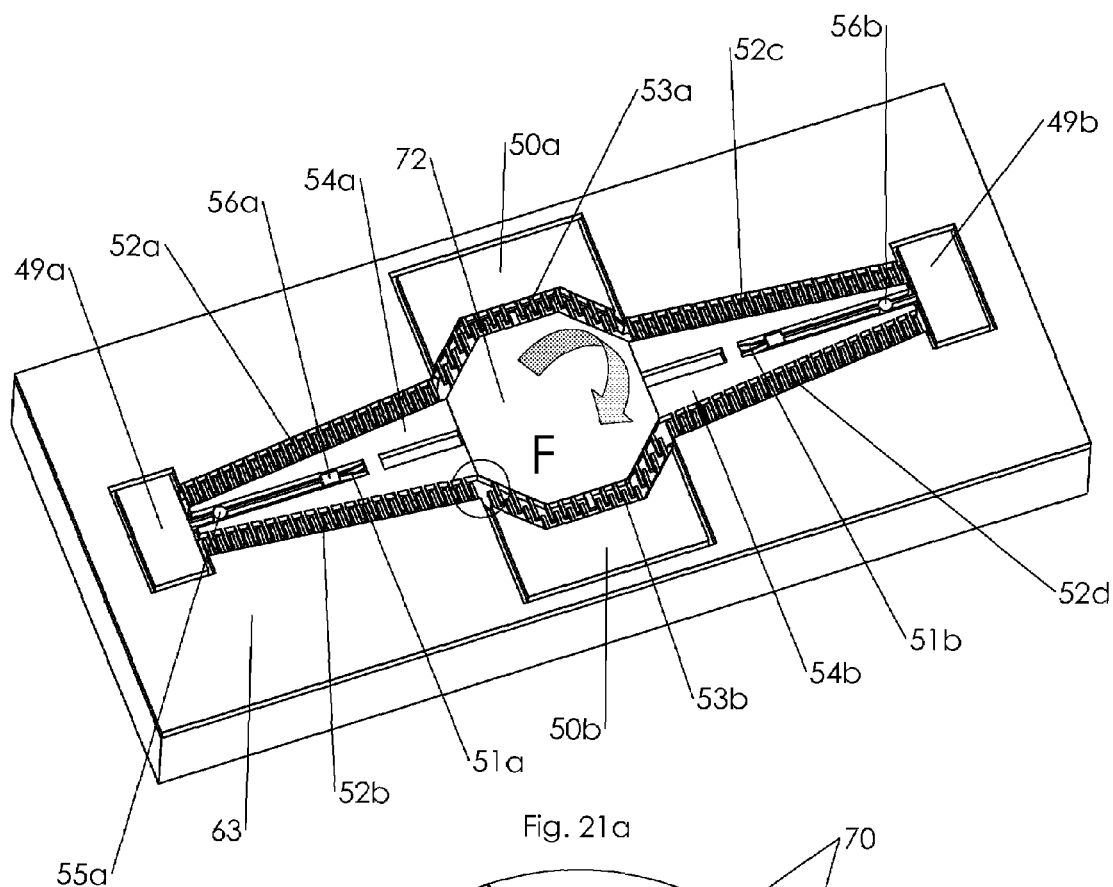
FIG. 21a is a perspective view of the final micro mirror device after etching away remaining buried oxide and photoresist.
Figure 21B:
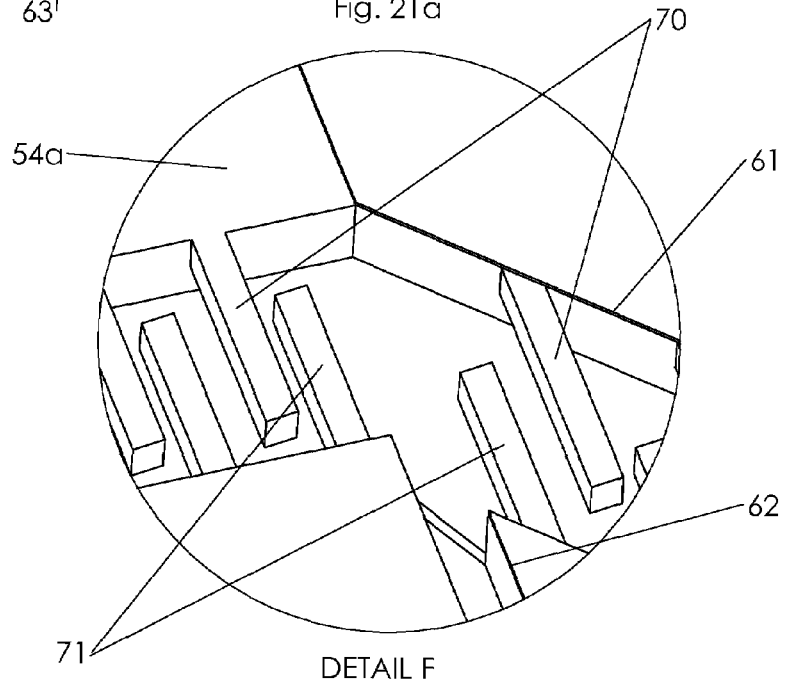

The last silicon DRIE etching is used to etch away the silicon on the lower comb finger to form its final shape, while the upper comb finger 70 is protected by the remaining oxide 33. The oxide Reactive Ion Etching (RIE) process is to etch away any remaining buried oxide on the upper comb fingers, arms, hinges and anchors. Oxygen plasma or equivalent photoresist ashing process is conducted to remove all the thick photoresist. The final shape of micromirror and its corresponding vertical combdrive actuator and mirror position detector are shown in FIG. 21. FIG. 21b shows the final shape of upper and lower comb fingers.

The bonding pads 49a and 49b are electrically connected to the micromirror 72 through mechanical stops 55a and 55b, anchors 56a and 56b, V shape hinges 51a and 51b as well as supporting arms 54a and 54b. All the comb fingers connected to the supporting arms 54a and 54b in the actuators (52a, 52b and 53c and 52d) and position detectors (53a and 53b) are movable and in the same electrical potential with the mirror 72.

As mentioned before, the vertical combdrive could have different design variations shown in FIG. 2 and FIG. 3, so the mirror can be actuated in one direction or two directions. The design configuration of the vertical combdrives in FIG. 21 is same as design configuration shown in FIG. 3. In FIG. 21, all the fixed combdrive fingers in 52a, 52c and 53a are upper fingers, while all the fixed combdrive fingers in 52b, 52d and 53b are lower fingers. Again, all the movable combdrive fingers in 52a, 52c and 53a are lower fingers, while all the fixed combdrive fingers in 52b, 52d and 53b are upper fingers.

When the bonding pad 49a or 49b is electrically grounded, and an electrical potential is applied on the metal layer 63, the mirror 72 will be actuated by 52a, 52b, 52c and 52d towards the same rotation at the same time. The mirror 72 will tilt in the direction indicated by the arrow in FIG. 21. Since all the vertical combdrive actuators 52a, 52b, 52c and 52d are working together to actuate the micromirror 72 at the same direction. This design approach will significantly reduce the actuation voltage while the quicker repose of the micromirror is still maintained. This micromirror design configuration is especially useful for Variable Optical Attenuator (VOA) with low driving voltage such as less than 5 volts.

For some applications, it is required to electrically monitor the actual mirror rotation. The present invention provides sensing structures to detect electrically the rotation of the micromirror. Present invention utilizes vertical combdrive 53a and 53b, which are electrically isolated and mechanically separated from actuators 52a, 52b, 52c and 52d. The movable and fixed comb fingers in 53a and 53b are no longer forming electrostatic actuators, instead; they are forming variable electrical capacitors when the micromirror is rotated by the actuators 52a, 52b, 52c and 52d. When the mirror 72 is actuated by actuator 52a, 52b, 52c and 52d, the relative position between the fixed and movable fingers in the vertical combdrive 53a and 53b are changed. This position change results in the capacitance change between the bonding pads 50a (and/or 50b) and bonding pads 49a or 49b.

Figure 22A:
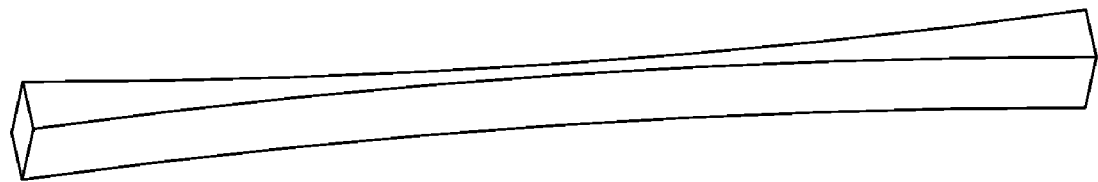
FIG. 22a is a perspective view of a taper shape hinge configuration.
Figure 22B:
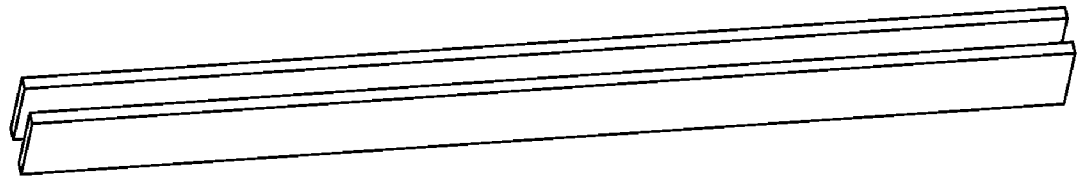
FIG. 22b is a perspective view of a double beam hinge configuration.

The hinge design also is very important to the actuation stability of vertical combdrive actuator. The hinges provide not only the flexures to support the mirror and allow the mirror rotate in the expected direction, but also suppress any undesirable side way movement of the micromirror. The micromirror in the present invention can have verities of hinge shape designs to meet such needs. V shape hinge is already presented in the previous description and process. Other hinge designs are also used in the present invention such the taper shape hinge and double beam hinge (FIG. 22). The V shape hinge, taper shape hinge and double beam hinge design provide very good stability in terms of preventing side snapping or side way instability of vertical combdrive actuator due to the process imperfection. Imperfection of microfabrication processes is one of major reasons to cause side way snapping of the combdrive actuators.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

It will be apparent to one skilled in the art that modifications may be made to the illustrated embodiment without departing from the spirit and scope of the invention as hereinafter defined in the claims.

What is claimed is:

1. A micro-electro-mechanical system (MEMS) micro mirror, comprising:
   a body having a mirror support, opposed anchors, and flexible hinges which connect the mirror support to the anchors;
   the mirror support having a mirror support surface, a first comb edge, a second comb edge opposed to the first comb edge, and comb fingers formed in a layer of silicon on insulator (SOI) extending outwardly from each of the first comb edge and the second comb edge;
   a first fixed electrode spaced from the first comb edge of the mirror support and having comb fingers formed in the layer of silicon on insulator extending outwardly toward the mirror support to interact with the comb fingers on the first comb edge and interlace upon movement of the mirror support of the body in a first direction about the flexible hinges, prior to being energized the comb fingers along the first comb edge being positioned on one horizontal plane and the comb fingers of the first fixed electrode being on another horizontal plane;
   a second fixed electrode spaced from the second comb edge of the mirror support and having comb fingers formed in the layer of silicon on insulator extending outwardly toward the mirror support to interact with the comb fingers on the second comb edge and interlace upon movement of the mirror support of the body in a second direction about the flexible hinges, prior to being energized the comb fingers along the second comb edge being positioned on one horizontal plane and the comb fingers of the second fixed electrode being on another horizontal plane.

2. A micro-electro-mechanical system (MEMS) micro mirror, comprising:
   a body having a mirror support, opposed anchors, and flexible hinges which connect the mirror support to the anchors;
   the mirror support having a mirror support surface, a first comb edge, a second comb edge opposed to the first comb edge, and comb fingers extending outwardly from each of the first comb edge and the second comb edge;
   a first fixed electrode spaced from the first comb edge of the mirror support and having comb fingers extending outwardly toward the mirror support to interact with the comb fingers on the first comb edge and interlace upon movement of the mirror support of the body in a first direction about the flexible hinges, prior to being energized the comb fingers along the first comb edge being positioned on one horizontal plane and the comb fingers of the first fixed electrode being on another horizontal plane;
   a second fixed electrode spaced from the second comb edge of the mirror support and having comb fingers extending outwardly toward the mirror support to interact with the comb fingers on the second comb edge and interlace upon movement of the mirror support of the body in a second direction about the flexible hinges, prior to being energized the comb fingers along the second comb edge being positioned on one horizontal plane and the comb fingers of the second fixed electrode being on another horizontal plane;
   wherein the comb fingers along the first comb edge of the mirror support are upper comb fingers positioned along the first comb edge in proximity to the mirror support surface and the comb fingers along the second comb edge are lower comb fingers positioned along the second comb edge in proximity to the underlying surface.

3. The MEMS micro mirror of claim 2, wherein the comb fingers of the first fixed electrode are on a first horizontal plane lower than the upper comb fingers and the comb fingers of the second fixed electrode are on a second horizontal plane higher than the lower comb fingers.

4. The MEMS micro mirror of claim 2, wherein the comb fingers along the first comb edge of the mirror support are upper comb fingers positioned along the first comb edge in proximity to the mirror support surface, and the comb fingers along the second comb edge are positioned along the second comb edge in proximity to the mirror support surface and on the same horizontal plane as the comb fingers along the first comb edge.

5. The MEMS micro mirror of claim 4, wherein the comb fingers of the first and second fixed electrodes are on a first horizontal plane lower than the upper comb fingers along the first and second comb edges.

6. The MEMS micro mirror of claim 2, wherein the comb fingers of the first fixed electrode and the comb fingers of the second fixed electrode are on different horizontal planes.

7. The MEMS micro mirror of claim 2, wherein the comb fingers of the first fixed electrode and the comb fingers of the second fixed electrode are on the same horizontal plane.

8. The MEMS micro mirror of claim 2, the flexible hinges of the mirror support having an axis of rotation parallel to the mirror surface, at least one mechanical stop is provided along the axis of rotation to laterally confine the flexible hinges to prevent side snapping of the mirror support of the body during operation.

9. The MEMS micro mirror of claim 2, wherein the mirror support has opposed tapered arms.

10. The MEMS micro mirror of claim 2, wherein the flexible hinges are V shaped with a wide portion of the V shape positioned toward the mirror support and a narrow portion of the V shape being opposite the wide portion.

11. The MEMS micro mirror of claim 2, wherein the flexible hinges are tapered.

12. The MEMS micro mirror of claim 2, wherein the flexible hinges are double beam hinges.

13. The MEMS micro mirror of claim 2, wherein the flexible hinges are located at least one third of a width of the mirror support from the mirror support to suppress rotation of the mirror support about an axis normal to the mirror support surface.

14. The MEMS micro mirror of claim 2, having a mirror position sensing structure, comprising:
   a plurality of comb fingers extending outwardly from each of the first comb edge and the second comb edge;
   a first and second fixed electrodes spaced from the mirror edge of the mirror support and having comb fingers extending outwardly toward the mirror support to interact with the comb fingers on the first and second mirror edges, opposed to the first mirror edge and interlace upon movement of the mirror support of the body in a first and a second directions about the flexible hinges, prior to being energized rotation, the comb fingers along the first mirror edge being positioned on one horizontal plane and the comb fingers of the first fixed electrode being on another horizontal plane, the comb fingers along the second mirror edge, being positioned on one horizontal plane and the comb fingers of the first fixed electrode being on another horizontal plane.

15. The mirror position sensing structure of claim 14, wherein capacitance detection is used to sense the relative positions of the fingers on the first and second of mirror edges to the fingers of the first and second the fixed electrodes.

16. The MEMS micro mirror of claim 2, wherein, prior to being energized, the horizontal planes of each of the comb fingers of the first comb edge and the first fixed electrode are mutually exclusive in a vertical direction, and the horizontal plane of each of the comb fingers of the second comb edge and the second fixed electrode are mutually exclusive in a vertical direction.

17. The MEMS micro mirror of claim 2, wherein the mirror support is formed in the layer of silicon on insulator, the layer of silicon on insulator having a thickness and the mirror support having a thickness that is less than the thickness of the layer of silicon on insulator.

18. The MEMS micro mirror of claim 2, wherein the body is mounted to a carrier substrate, the mirror support and the substrate defining a cavity having a selected height to provide a desired air damping effect.

19. The MEMS micro mirror of claim 18, wherein at least a portion of the carrier substrate immediately adjacent to the mirror support is patterned with a metal film to prevent an accumulation of charge on the portion of the carrier substrate immediately adjacent to the mirror support.

20. The MEMS micro mirror of claim 18, wherein at least a portion of the carrier substrate immediately adjacent to the mirror support is patterned with a metal film to form a bottom driving electrode to provide an additional electrostatic actuation force.

21. The MEMS micro mirror of claim 2, comprising a low stress metal film deposited on the mirror support surface, and the electrodes comprise a deposited metal film having a thickness greater than the low stress metal film to reduce its resistance.

* * * * *